US007323288B2

(12) United States Patent
Yu et al.

(10) Patent No.: US 7,323,288 B2
(45) Date of Patent: Jan. 29, 2008

(54) LAYERS IN PRINTING PLATES, PRINTING PLATES AND METHOD OF USE OF PRINTING PLATES

(75) Inventors: Yisong Yu, Vancouver (CA); Brian J. Collister, Burnaby (CA); Jonathan W. Goodin, Tyler, TX (US); Graham Darling, Burnaby (CA); Jacqueline L. Ricafrente, Surrey (CA)

(73) Assignee: Kodak Graphic Communications Canada Company, Burnaby, British Columbia (CA)

( * ) Notice: Subject to any disclaimer, the term of this patent is extended or adjusted under 35 U.S.C. 154(b) by 456 days.

(21) Appl. No.: 10/647,913

(22) Filed: Aug. 25, 2003

(65) Prior Publication Data

US 2004/0202962 A1 Oct. 14, 2004

Related U.S. Application Data

(60) Provisional application No. 60/436,182, filed on Dec. 23, 2002.

(51) Int. Cl.
*G03C 1/77* (2006.01)
*G03F 7/038* (2006.01)
*G03F 7/09* (2006.01)

(52) U.S. Cl. .............................. 430/271.1; 430/270.1; 430/302; 430/944

(58) Field of Classification Search ............. 430/270.1, 430/300, 302, 944, 905, 911, 910, 271.1
See application file for complete search history.

(56) References Cited

U.S. PATENT DOCUMENTS

| | | | | |
|---|---|---|---|---|
| 4,081,571 | A | 3/1978 | Nishihama et al. | |
| 4,081,572 | A | 3/1978 | Pancansky | |
| 4,634,659 | A | 1/1987 | Esumi et al. | |
| 5,569,573 | A | 10/1996 | Takahashi et al. | |
| 5,958,514 | A | 9/1999 | Havey et al. | |
| 6,096,471 | A | 8/2000 | Van Damme et al. | |
| 6,110,645 | A | 8/2000 | DeBoer et al. | |
| 6,252,003 | B1 * | 6/2001 | Kuwahara et al. | 525/242 |
| 6,410,202 | B1 | 6/2002 | Fleming et al. | |
| 6,513,433 | B2 | 2/2003 | Inoue et al. | |
| 6,528,237 | B1 | 3/2003 | Leenders et al. | |
| 6,821,556 | B2 * | 11/2004 | Ishida et al. | 427/152 |
| 6,899,994 | B2 | 5/2005 | Huang et al. | |
| 2002/0007751 | A1 * | 1/2002 | Inoue et al. | 101/453 |

FOREIGN PATENT DOCUMENTS

| | | | |
|---|---|---|---|
| EP | 0925916 | | 6/1999 |
| EP | 0949088 | | 10/1999 |
| EP | 1057622 | | 12/2000 |
| EP | 1108534 | | 6/2001 |
| EP | 1338435 | | 8/2003 |
| JP | 62-46260 | * | 2/1987 |
| JP | 2001162961 | | 6/2001 |

OTHER PUBLICATIONS

English abstract for JP 62-46260, provided by JPO.*

* cited by examiner

*Primary Examiner*—Sin Lee
(74) *Attorney, Agent, or Firm*—J. Lanny Tucker

(57) ABSTRACT

A radiation-sensitive medium comprises hydrophilic polymer particles, the particles comprising a thermally softenable hydrophobic polymer, a hydrophilic polymer and a bonding compound capable of chemically bonding to the hydrophobic polymer and to the hydrophilic polymer. Th radiation-sensitive medium further may comprise a substance capable of converting radiation into heat. The radiation-sensitive medium is aqueous-ineluable when coated and dried, and becomes hydrophobic under the action of heat. The polymer particles are made by polymerization of at least one hydrophobic monomer and at least one bonding compound in the presence of the hydrophilic polymer. The radiation-sensitive medium may be provided as a coatable composition to be applied to substrates to form a processless radiation-imageable lithographic printing precursor. The processless radiation-imageable lithographic printing precursor so created may be imaged using absorbed radiation that is imagewise converted to heat, resulting in areas of hydrophobic property, while unimaged areas retain their hydrophilic property. This allows the latent image so formed to be employed in creating a negative-working lithographic printing master. The negative-working lithographic printing master so created is irreversible, does not require a substrate of controlled hydrophilicity and provides great toughness in the exposed areas. The radiation-sensitive medium may be coated on-platesetter or on-press onto a suitable substrate, including the drum of the press. It may also be coated off-press on a suitable substrate to create a precoated processless radiation-imageable lithographic printing precursor.

21 Claims, No Drawings

LAYERS IN PRINTING PLATES, PRINTING PLATES AND METHOD OF USE OF PRINTING PLATES

CROSS-REFERENCE TO RELATED APPLICATION

This application claims the benefit of U.S. provisional application 60/436,182 filed on Dec. 23, 2002.

FIELD OF THE INVENTION

This invention relates to image formation in printing plates and printing plate precursors and to the formation of images directly from electronically composed digital sources without wash-off development.

BACKGROUND OF THE INVENTION

For many years, it has been a goal of the printing industry to form printing images directly from an electronically composed digital database, for example, by a so-called “computer-to-plate” system. The advantages of such a system over the traditional methods of making printing plates are the elimination of the costly intermediate silver-containing film and processing chemicals; a saving of time; and the ability to automate the system with consequent reduction in labor costs.

The introduction of laser technology provided the first opportunity to form an image directly on a printing plate precursor by directing a laser beam at sequential areas of the printing plate precursor and modulating the beam so as to vary its intensity. In this way, radiation sensitive plates comprising a high sensitivity photocrosslinkable polymer coating have been exposed to imagewise distributions of radiation from various laser sources and electrophotographic printing plate precursors having sensitivity ranging from the visible spectral region into the near infra-red region (including thermal sensitivity) have been successfully exposed using low powered air-cooled argon-ion lasers and semiconductor laser devices.

While lithographic printing precursors post-exposure developable using aqueous media, preferably alkaline aqueous media, are well known and widely used in the printing industry, there is a more specific subset of precursors that may be developed on press by the action of the fountain solution employed during wet offset printing. A newer class of lithographic media is based upon the general concept of employing polymeric particles in an otherwise hydrophilic binder, often along with a substance to convert light into heat. This kind of media is exemplified by U.S. Pat. No. 6,001,536. The unilluminated areas of a lithographic precursor based on this generic media may be removed by treatment with fountain solution on a printing press. This kind of precursor is therefore pseudo-processless, in that no specific separate development step with a specific developer, as such, is required to obtain a master. The illuminated areas are rendered hydrophobic and hence the master is in effect negative-working. These precursors allow lithographic printing masters to be made relatively easily on-press, but suffer from poor run length. The quality of the printed image rendered is directly dependent on the choice and quality of hydrophilic substrate used, as this substrate is exposed and has to carry the fountain solution during the wet offset printing process.

A more specific category of lithographic precursors employs mechanisms and compositions that cause the sensitive layer on the substrate to switch between hydrophilic and hydrophobic, without any material being required to be removed with a development step. That is, there is no removal of material at all, even by fountain solution. These are true processless precursors.

By way of example, U.S. Pat. No. 6,410,202 describes a composition for thermal imaging comprising a hydrophilic heat-sensitive polymer having recurring ionic groups within the polymer backbone or chemically attached thereto. The imaging members of this particular invention do not require post-imaging wet processing and are generally negative-working in nature. In some cases, the polymers are crosslinked upon exposure and provide increased durability to the imaging members. In other and preferred cases, the polymers are crosslinked upon application to a support and curing. A further example of this class of precursor is provided by U.S. Pat. No. 5,985,514. That patent describes an imaging member that is composed of a hydrophilic imaging layer having a hydrophilic heat-sensitive polymer containing heat-activatable thiosulfate groups, and optionally a photothermal conversion material. Upon application of energy that generates heat, such as from IR irradiation, the polymer is crosslinked and rendered more hydrophobic. The exposed imaging member can be contacted with a lithographic printing ink and a fountain solution and used for printing with or without post-imaging wet processing. U.S. Pat. No. 4,081,572 describes making hydrophilic printing masters comprising coating a self-supporting master substrate with a specific hydrophilic polymer containing carboxylic acid functionality and selectively converting this polymer in image configuration to a hydrophobic condition by heat. The polymer is selectively converted to a hydrophobic condition in image configuration through heat-induced cyclodehydration reactions. In other examples the precursor is inherently positive-working, as in the case of U.S. Pat. No. 4,634,659. That particular patent describes a method of making a processing-free planographic printing plate comprising irradiating a plate surface comprised of a hydrophobic organic compound capable of being converted, upon exposure to radiation, from hydrophobic to hydrophilic, carrying out the exposure in an image pattern, thereby selectively converting said surface, in the image pattern, from hydrophobic to hydrophilic, thereby making th precursor positive-working.

A yet more specific category of true processless lithographic precursors, is based on media comprising polymer-based particles or microcapsules:

In U.S. Pat. No. 6,550,237 a heat-sensitive material is described for making a negative working non-ablative lithographic printing plate including in a heat sensitive layer thermoplastic polymer beads and a compound capable of converting light into heat on a surface of a hydrophilic metal support. The layer is free of binder, and is characterized in that the thermoplastic polymer beads have a diameter between 0.2 μm and 1.4 μm. Argument is provided for the requirement that the thermoplastic particles should have a specific size range. It is explained that, when the polymer particles are subjected to a temperature above the coagulation temperature they coagulate to form a hydrophobic agglomerate so that at these parts the metallic support becomes hydrophobic and oleophilic. Preferably, the polymer particles are selected from the group consisting of polyvinyl chloride, polyvinylidene chloride, polyacrylonitrile, polyvinyl carbazole etc., copolymers or mixtures thereof. Most preferably used are polystyrene, polyacrylate or copolymers thereof and polyesters or phenolic resins. No indication is given that the polymer particles should be hydrophilic, or that there may be more than one polymer in the particles.

In European Patent Application No. EP01057622, a lithographic printing plate precursor requiring no development step is described. It comprises a support, having provided thereon a layer comprising a hydrophilic medium, wherein the layer comprising a hydrophilic medium contains a hydrophobitization precursor having a hydrophilic surface and a light/heat converting agent which is hydrophilic in itself, or at least on the surface. Various implementations of the invention are presented in which the hydrophobitization precursor having a hydrophilic surface is a particle dispersion of composite constitution containing a hydrophobic substance at the core part and having a surface layer of specifically superficial hydrophilicity. All forms of particles diclosed are composed of either one or two distinct materials. Various materials may be at the core, including hydrophobic polymeric materials and crosslinking materials. A light-to-heat converting material, which is specifically chosen to be hydrophilic, is also added.

U.S. Pat. No. 5,569,573 describes a thermosensitive lithographic printing original plate comprising a substrate, a hydrophilic layer containing a hydrophilic binder polymer, and a microcapsuled oleophilic material which forms an image area by heating; the hydrophilic binder polymer having a three-dimensional cross-link and a functional group which chemically combines with the oleophilic material in the microcapsule when the microcapsule is ruptured, and the microcapsuled oleophilic material having a functional group which chemically combines with the hydrophilic binder polymer when the microcapsule is ruptured. Among the many hydrophilic binder polymers listed are polysaccharides.

There remains a requirement for negative-working, true processless, lithographic precursors having long run-length, suitable sensitivity to laser-diode-based imaging radiation, and which are easy to prepare, preferably from aqueous media.

SUMMARY OF THE INVENTION

A radiation-sensitive medium comprises hydrophilic polymer particles, the particles comprising a thermally softenable hydrophobic polymer, a hydrophilic polymer and a bonding compound capable of chemically bonding to the hydrophobic polymer and to the hydrophilic polymer. The radiation-sensitive medium further may comprise a substance capable of converting radiation into heat. The radiation-sensitive medium is aqueous-ineluable when coated and dried, and becomes hydrophobic under the action of heat. The polymer particles are made by polymerization of at least one hydrophobic monomer and at least one bonding compound in the presence of the hydrophilic polymer. The radiation-sensitive medium may be provided as a coatable composition to be applied to substrates to form a processless radiation-imageable lithographic printing precursor. The processless radiation-imageable lithographic printing precursor so created may be imaged using absorbed radiation that is imagewise converted to heat, resulting in areas of hydrophobic property, while unimaged areas retain their hydrophilic property. This allows the latent image so formed to be employed in creating a negative-working lithographic printing master. The negative-working lithographic printing master so created is irreversible, does not require a substrate of controlled hydrophilicity and provides great toughness in the exposed areas. The radiation-sensitive medium may be coated on-platesetter or on-press onto a suitable substrate, including the drum of the press. The radiation-sensitive medium of the present invention may be coated off-press on a suitable substrate to create a precoated processless radiation-imageable lithographic printing precursor.

DETAILED DESCRIPTION OF THE INVENTION

In a first aspect of the invention there is provided a radiation-sensitive medium comprising hydrophilic polymer particles, the particles comprising a thermally softenable hydrophobic polymer, a hydrophilic polymer and a bonding compound capable of chemically bonding to the hydrophobic polymer and to the hydrophilic polymer. The radiation-sensitive medium further may comprise a substance capable of converting radiation into heat. The radiation-sensitive medium is aqueous-ineluable when coated and dried, and becomes hydrophobic under the action of heat.

In a further aspect of the invention there is provided a method for making the radiation-sensitive medium of the invention by polymerization of at least one hydrophobic monomer and at least one bonding compound in the presence of the hydrophilic polymer.

In a further aspect of the invention there is provided a method for making a processless radiation-imageable lithographic printing precursor, comprising the coating of the steps of radiation-sensitive medium of the invention onto a substrate and drying said coated radiation-sensitive medium.

In a further aspect of the invention there is provided a precoated processless radiation-imageable lithographic printing precursor, comprising the radiation-sensitive medium of the invention precoated onto a substrate and dried.

In yet a further aspect of the invention there is provided a method for making a negative working lithographic printing master using the precoated processless radiation-imageable lithographic printing precursor. The precoated processless radiation-imageable lithographic printing precursor may be imaged using absorbed radiation that is imagewise converted to heat, transforming hydrophilic areas to hydrophobic areas, resulting in areas of hydrophilic and areas of hydrophobic property. This allows the latent image so formed to be employed in making a negative-working lithographic printing master. The imaging process is irreversible when performed. That is, the coated and dried radiation-sensitive medium remains hydrophobic after imagewise exposure to imaging radiation. The method may be performed on a plate-setting machine or fully on-press.

Definitions:

The term "negative-working lithographic printing master" is used herein to describe a lithographic printing master on which, during the process of transferring printing ink from the master to a printing medium for receiving printing ink, the printing ink adheres to those areas that were irradiated or written to in any way whatsoever by an imaging head and, conversely, on which printing ink does not adhere to those areas that were not irradiated or written to in any way by that imaging head. Whether the master is referred to as negative-working or positive-working is therefore not determined by the means of creating ink-bearing and non-ink-bearing areas on the master, but rather by whether the positive image to be created on the printing medium for receiving the printing ink, or the negative of it, respectively, is transferred to the master from the imaging head. In brief, on a "negative-working lithographic printing master", those areas that are written by the imaging head will carry printing ink.

The phrase "processless radiation-imageable lithographic printing precursor" is used herein to describe a radiation-imageable lithographic printing precursor that requires no imagewise removal of, or imagewise addition to, any part of the precursor after imagewise exposure of the precursor to radiation in order to form a lithographic printing master.

The phrase "precoated processless radiation-imageable lithographic printing precursor" is used herein to describe a processless lithographic printing precursor that comprises a radiation-sensitive medium coated onto a substrate.

Substrates may specifically include printing press drums or sleeves, the drums or sleeves being precoated with radiation-sensitive medium, or with radiation-sensitive medium and an adhesion-promoting layer.

The term "eluent" refers to any fluid, either liquid or gaseous, which is capable of dissolving or otherwise placing the unpatterned coating of the radiation-sensitive medium into a dispersible form.

The term "dispersible" means, with respect to a layer of given material, that the material is capable of displacement or removal, including lifting off, by physical or chemical action of a fluid.

The term "aqueous-ineluable" is used to describe a property of a radiation-sensitive medium coated on a substrate, whereby the radiation-sensitive medium is not dissolved or otherwise dispersible by an aqueous eluent. It must be remembered that nearly any material may be etched or dissolved, so that this term applies only to fluids that are intended to be used in the treatment of the layer (e.g., water, low alkaline content aqueous solutions, acidic solutions, aqueous solutions with low amounts of organic compounds such as 10% isopropanol or methoxypropanol, and other fountain solutions used on printing presses.)

The term saccharide is used herein as defined by IUPAC, being inclusive of monosaccharides and di-, oligo- and polysaccharides, the di-, oligo- and polysaccharides being made up of a plurality of monosaccharide units linked to each other by a glycosidic bond.

Composition of the Radiation-sensitive Medium

In a first embodiment of the present invention, a radiation-sensitive medium comprises a continuous phase and hydrophilic polymer particles. The hydrophilic polymer particles comprise a thermally softenable hydrophobic polymer, a hydrophilic polymer and a bonding compound capable of chemically bonding to the hydrophobic polymer and to the hydrophilic polymer. The polymer particles are made by polymerization of at least one hydrophobic monomer and at least one bonding compound in the presence of the hydrophilic polymer. The radiation-sensitive medium of the present invention, when coated and dried, is aqueous-ineluable and a layer of the radiation-sensitive medium becomes hydrophobic when imaged using absorbed radiation that is imagewise converted to heat. A substance capable of converting radiation into heat is preferably added to the composition to create a suitably radiation-sensitive medium.

The hydrophilic polymer particles are hydrophilic to a substantial depth, with only a core region of the particles being hydrophobic. A "substantial depth" means a depth that is sufficiently large that when a lithographic printing master made from a coated precursor in accordance with the invention is employed in printing, the hydrophilic areas of the coating will not erode sufficiently to expose the hydrophobic core of the particles and thereby detrimentally affect printing quality to a material degree. Being hydrophilic to a substantial depth stands in contrast to the various particle types discussed in patent application EP01 057622, which are either entirely hydrophilic or have only a superficial hydrophilic surface region or coating. The polymer particles of the present invention are distinctly hydrophilic, compared with the hydrophobic particles disclosed in U.S. Pat. No. 6,550,237. Without wishing the invention to be limited in any way, the inventors believe that the cores of the particles are dominated by the hydrophobic polymer derived from the hydrophobic monomer, while the bulk of any given particle is dominated by the hydrophilic polymer. It is believed that there is a transition region wherein there are co-polymers of both the hydrophobic monomer and the hydrophilic polymer with the bonding compound (itself preferably hydrophilic as a polymer), producing thereby a particle that has three regions, namely, an inner hydrophobic core, a transition region that is largely hydrophilic, due to the nature of the preferred bonding compounds, and the bulk of the particle, being dominated by the hydrophilic polymer.

The hydrophobic monomer of the present invention is selected from electrically neutral ethylenically unsaturated monomers such as ethylene, propylene, styrene, other vinyl monomers (e.g. methyl methacrylate), and electrically neutral derivatives of these ethylenically unsaturated monomers. The term "electrically neutral" is well understood in the art and includes primarily non-polar compounds, although monomers with internal charge distributions and overall electrical neutrality (e.g., Zwitterions) are acceptable.

The bonding compound of the present invention is preferably selected from within the classes of water-soluble/dispersible ethylenically unsaturated monomers, especially acryloyl or methacryloyl monomers and anionic-substituted styrene monomers, and especially acryloyl acids (i.e., acrylic acid, and methacrylic and other substituted acrylic acids) and sulfonated or phosphonated styrenes (e.g., with alkali or alkaline metal or ammonium counterions such as Na, Li, K and the like).

The hydrophilic polymer of the present invention is preferably selected from chitosan polymers (which includes derivatized chitosan as described herein), polyethyleneimine resins, polyamine resins (for example polyvinylamine polymers, polyallylamine polymers, polydiallylamine resins and amino(meth)acrylate polymers), polyamide resins, polyamide-epichlorohydrin resins, polyamine-epichlorohydrin resins, polyamidepolyamine-epichlorohydrin resins, as well as dicyandiamide-polycondensation products (for example, polyalkylenepolyamine-dicyandiamide copolymers). These polymers may be employed alone or in a mixture or copolymer of two or more thereof. The polymers preferably have a molecular weight of 5,000 to 500,000, more preferably 5,000 to 200,000. The content of hydrophilic polymer is preferably 5 to 65% by weight, based on the total weight of the imageable layer.

The hydrophilic polymer of the present invention may also comprise saccharides, such as cellulose or starch, or a mixture of such saccharides. The present invention allows for the hydrophilic polymer to be comprised of a mixture of hydrophilic cationic resins and saccharides. Furthermore, the hydrophilic polymer of the present invention may be a derivative of a saccharide and mixtures thereof with any one or more other hydrophilic cationic resin and saccharide.

In one embodiment of the invention, the coatable compositions comprise latices in aqueous carriers, the latices comprising dissolved chitosan and particles comprised of thermally softenable hydrophobic polymer, hydrophilic polymer and the bonding compound, bonding the hydrophobic polymer and the hydrophilic polymer. In this embodiment, therefore, there is dissolved chitosan present, in addition to chitosan that may be the hydrophilic polymer of the hydrophilic polymer particles. The composition may also contain additives to assist in the imaging steps and/or the coating steps. For example, a substance capable of converting the imaging radiation into heat is particularly desirable in the compositions so that the imaging radiation is efficiently absorbed and converted to heat to assist in the softening and coalescing of the polymer particles. The composition preferably contains at least 0.05 to 10% by weight of solids of a substance capable of converting radiation to heat. The substance capable of converting radiation to heat may be a pigment, such as, but not limited to, carbon black, or a dye. Infrared and near infrared (NIR) dyes are particularly suitable for use with infrared (IR) lasers.

In a preferred embodiment of the present invention the substance capable of converting radiation to heat absorbs radiation over the range 700 nm to 1200 nm, more preferably over the range 800 nm to 1100 nm, and most preferably over the range 800 nm to 850 nm, and converts it to heat. Examples of such substances are disclosed in JOEM Handbook 2 Absorption Spectra of Dyes for Diode Lasers, Matsuoka, Ky., bunshin Shuppan, 1990 and Chapter 2, 2.3 of Development and Market Trend of Functional Colouring Materials in 1990's, CMC Editorial Department, CMC, 1990, such as polymethine type coloring material, a phthalocyanine type coloring material, a dithiol metallic complex salt type coloring material, an anthraquinone type coloring material, a triphenylmethane type coloring material, an azo type dispersion dye, and an intermolecular CT coloring material. The representative examples include N-[4-[5-(4-dimethylamino-2-methylphenyl)-2,4-pentadienylidene]-3-methyl-2,5-cyclohexadiene-1-ylidene]-N,N-dimethylammonium acetate, N-[4-[5-(4-dimethylaminophenyl)-3-phenyl-2-pentene4-in-1-ylidene]-2,5-cyclohexadiene-1-ylidene]-N,N-dimethylammonium perchlorate, bis(dichlorobenzene-1,2-dithiol)nickel(2:1)tetrabutylammonium and polyvinylcarbazol-2,3-dicyano-5-nitro-1,4-naphthoquinone complex. Some specific commercial products that may be employed as substance capable of converting radiation to heat include Pro-jet 830NP, a modified copper phthalocyanine from Avecia of Blackley, Lancashire in the U.K., and ADS 830A, an infra-red absorbing dye from American Dye Source Inc. of Montreal, Quebec, Canada. Hydrophobic forms of these dyes are particularly preferred as this property makes these dyes more compatible with the hydrophobic aspect of the particles, thereby facilitating heat trasnfer to the thermally softenable hydrophobic polymer when radiation is being absorbed and heat produced during irradiation of the medium coated on a lithographic base.

Cosolvents (e.g., alcohols, ketones, and other organic solvents), surfactants, blowing agents, and filler (e.g., silica, titania, zinc oxide, zirconia, etc.) are also useful additives, and may be present in non-limiting exemplary amounts of up to 25% by weight of total solids, and the like. The use of filler particles, preferably having volume average particle sizes of between 0.01 to 0.5 micrometers, and less than 50% of the volume average size of the polymeric particles, is particularly desirable. Especially when using inorganic filler particles, such as metal or semimetal oxides or silica, the particles can add a surprisingly higher level of on-press durability to lithographic printing masters prepared from the radiation-sensitive medium of the present invention.

Preferably, the polymer or polymers that constitute the thermally softenable hydrophobic polymer component of the particles have a film forming temperature above ambient temperature (e.g., 20° C.) and may comprise any thermally softenable or heat-fusible polymer, and, by way of non-limiting examples, may be an addition polymer comprising residues derived from one or more of styrene, substituted styrenes, esters of (meth)acrylic acid, vinyl halides, (meth) acrylonitrile, vinyl esters, silicon-containing polymerizable monomers or polyethers. It may also be a polyester, polyamide or polyurethane, or any thermally fusible oleophilic material or composition capable of forming a hydrophobic center/hydrophilic outer layer structure by polymerization with one or more anionic monomers. Preferred materials are addition polymers containing 50% or more by weight of styrene or substituted styrenes. Most preferred materials are polymers containing 50% or more by weight of esters of (meth)acrylic acid. The hydrophobic centers of the polymer particles preferably soften at temperatures such as from 30° C. to 300° C., and more preferably from 50° C. to 200° C. to allow coalescence, flow, phase change or any other phenomenon to occur within or between the particles to effect the hydrophilicity decrease in the surface of the layer. Suitable examples of esters of (meth)acrylic acid include, but are not limited to, methyl (meth)acrylate, ethyl (meth) acrylate, propyl (meth)acrylate, butyl (meth)acrylate and lauryl (meth)acrylate. Suitable examples of substituted styrenes include, but are not limited to, alpha-methylstyrene and vinyltoluene. Suitable examples of substituted vinyl esters include, but are not limited to, vinyl acetate and vinyl propionate. Suitable examples of vinyl halides include, but are not limited to, vinyl chloride and vinylidene chloride.

Co-monomers used with these monomers may include up to 50% by weight of polymerizable monomers having carbon-carbon double bonds including, but not limited to monomers having various types of carboxyl groups, such as acrylic acid, methacrylic acid, crotonic acid, itaconic acid, fumaric acid, maleic acid, citraconic acid and their salts; monomers having various types of hydroxyl groups, such as 2-hydroxyethyl (meth)acrylate, 2-hydroxypropyl (meth) acrylate, 4-hydroxybutyl (meth)acrylate, monobutylhydroxyl fumarate and monobutylhydroxyl itaconate; various types of nitrogen-containing vinyl monomers such as (meth) acrylamides, diacetone acrylamides, N-methylol acrylamides; sulphonamide- or phosphorus-containing vinyl monomers; various types of conjugated dienes such as butadiene; dicarboxylic acid half-esters of hydroxyl group-containing polymers, such as phthalic, succinic or maleic acid half esters of a polyvinyl acetal and, in particular, of a polyvinyl butyral; and alkyl or aralkyl half esters of styrene- or alkyl vinyl ether-maleic anhydride copolymers, in particular alkyl half esters of styrene-maleic anhydride copolymers.

In a preferred embodiment of the invention, the hydrophilic polymer is chitosan, which is normally prepared from chitin. Chitosan, an aminopolysaccharide, is bio-friendly. Despite its abundance in nature, chitin has not been effectively utilized because of its low solubility in aqueous solutions. Owing to this problem, chitin is difficult to form into fibers or films and thus, has found limited applications. In an effort to overcome this problem, chitin is often converted into chitosan. A deacetylation technique is generally used for the conversion of chitin into chitosan. U.S. Pat. No. 3,533,940 discloses a method for preparing chitosan from chitin, along with its application to fibers and films. For possible applications, the prepared chitosan is dissolved in aqueous organic solutions.

Chitosan may be provided in the practice of the present invention in a wide range of properties as long as its hydrophilic surface properties are maintained. A non-limiting example of the types of chitosan that are particularly useful in the practice of the invention are chitosan which ranges in molecular weight from 5,000 to 500,000, more preferably 5,000 to 200,000, and in deacetylation degree from 60 to 99%, more preferably from 70 to 95%. The chitosan also provides an emulsifying agent for the thermally softenable or fusible polymer particles when in the coating composition.

Synthesis of the Radiation-sensitive Medium

A preferred mode of synthesis of the radiation-sensitive medium of the present invention is performed via the following steps, illustrated by, but not limited to, the use of chitosan as hydrophilic polymer. The hydrophilic polymer is dissolved in a suitable solvent and the hydrophobic monomer is added. An initiator may be added in either of these steps. The resultant mixture is polymerized by heating. The bonding compound may be added either during or after the polymerization of the hydrophobic monomer. The substance capable of converting radiation to heat is added prior to coating. Minor amounts of co-solvents, blowing agents, fillers and surfactants may be added at various stages of the synthesis.

Any solvent may be used that dissolves the chitosan and not the hydrophobic monomer, selected from aqueous acidic solutions, aqueous inorganic salt solutions and organic solvents. To obtain an aqueous acidic solution, which is a desired route in practicing the invention, water is added with 0.1-20 wt % of an acid, which is selected from the group consisting of organic acids, such as acetic acid and lactic acid, and inorganic acids, such as hydrochloric acid. Available inorganic salt solutions that can assist in the dissolving of chitosan include, by way of non-limiting examples, an inorganic salt at an amount of 10-70 wt % in water. The inorganic salt is particularly desirably selected from the group consisting of alkali metal (e.g., sodium) thiocyanate, metal chlorides (e.g., zinc chloride, calcium chloride, sodium chloride, potassium chloride, lithium chloride, and mixtures thereof). Organic solvents that may be useful in carrying the dissolved chitosan in the present invention are polar, examples of which include dimethylacetamide, N-methylpyrrolidone, dimethylformamide, diethylacetamide, trifluoroacetic acid, trichloroacetic acid, and mixtures thereof. In order to obtain higher polarity, one or more selected from the above-mentioned inorganic metal salts may be added at an amount of 0.1-10 wt % to the organic solvent.

The polymerization process can be effected as described by Wen-Yen Chiu et al. in Journal of Polymer Science A (Polymer Chemistry) volume 39, 2001, pp1646-1655. The co-monomer, e.g. (meth)acrylic acid, can be copolymerized with the primary component of the hydrophobic polymer composition, e.g. styrene or methyl methacrylate. In the polymerization process, an initiator (e.g., persulfate-metabisulfite) must be present. Other commonly known initiators for radical polymerization can also be used to give satisfactory polymers as described by Odian in Principles of Polymerization, 3$^{rd}$ Edition, publisher John Wiley & Sons, NY (1991) pp212-215, 219-225 and 229-232.

The post-polymerization mix may generally comprise the following:

- solvent (40-97 w/w % of total mix)
- excess dissolved hydrophilic solubilizable polymer (0.01-50 w/w % of total mix)
- particles comprising electrically neutral hydrophobic polymer (10-59 w/w/o of total mix)

The post-polymerization mix comprises a continuous phase and a dispersed phase, the dispersed phase comprising 50-100 w/w % of polymerized electrically neutral hydrophobic monomer and 0-50 w/w % polymerized anionic monomer. The post-polymerization mix may contain suspended solids in the size range from 0.01 to 5 microns.

Minor amounts of additives may be added at various stages of the polymerization or particle formation process. Surfactants can be added (e.g., silicone-polyol) to improve film forming quality when the composition is coated onto a surface. A plasticizer may be added at any time before coating of the composition, but is preferably present well before the coating to allow it to mix with the polymer.

In a further step 0.05 to 10 w/w % of solids of the substance capable of converting radiation into heat is added. Other additives, including the co-solvents, surfactants, blowing agents and fillers, can be added in amounts from 0-25 w/w % of solids.

Preparation of the Precoat d Processless Radiati n-imageabl Lithographic Printing Precurs r The radiation-sensitive medium is applied to a substrate and dried by the standard coating and drying methods employed in the manufacture of printing plate precursors and other metal, plastic, ceramic and paper products, to create a radiation-imageable layer. The substrate material used depends upon the purpose for which the image is to be used and may be, for example, formed of metal, polymer material (such as, but not limited to, PET), paper, ceramic, or composite material. The substrate is preferably aluminum and more preferably chemically treated aluminum, grained aluminum, anodized aluminum, aluminum coated substrates, or combinations thereof. Preferably, the substrate is sufficiently flexible to facilitate mounting on presses. To the extent that the precoated processless radiation-imageable lithographic printing precursor of the present invention does not require any water carrying or water abhesive quality from the substrate, the substrate being not exposed during printing, there is wide scope of choice for the materials of which the substrate may be composed.

According to another embodiment in connection with the present invention, the substrate comprises a flexible support, such as e.g. paper or plastic film, provided with a further adhesion-promoting layer of cross-linked polymer. A suitable cross-linked hydrophilic layer may be obtained from a hydrophilic (co-) polymer cured with a cross-linking agent such as a hydrolysed tetra-alkylorthosilicate, formaldehyde, glyoxal or polyisocyanate. Particularly preferred is the hydrolysed tetra-alkylorthosilicate. For the purposes of the present invention, this layer must be capable of being wetted by the radiation-sensitive medium to give a good quality of coating and is therefor usually hydrophilic. The hydrophilic (co-) polymers that may be used comprise for example, homopolymers and copolymers of vinyl alcohol, hydroxyethyl acrylate, hydroxyethyl methacrylate, acrylic acid, methacrylic acid, acrylamide, methylol acrylamide or methylol methacrylamide. The hydrophilicity of the (co-) polymer or (co-) polymer mixture used is preferably higher than that of polyvinyl acetate hydrolyzed to at least an extent of 60 percent by weight, preferably 80 percent by weight.

In a further embodiment of the invention, an adhesion-promoting layer is coated on the substrate. Suitable adhesion-promoting layers for use in accordance with the present invention comprise a hydrophilic (co-) polymer binder and colloidal silica as disclosed in EP 619524, and EP 619525.

Preferably, the amount of silica in the adhesion-promoting layer is between 0.2 and 0.7 mg per $m^2$. Further, the ratio of silica to hydrophilic (co-) polymer binder is preferably more than 1 and the surface area of the colloidal silica is preferably at least 300 $m^2$ per gram.

Preparation of the Negative-working Lithographic Printing Master

The preparation of the negative-working lithographic printing master may be performed on a platesetter machine or directly on the printing press. In both cases, the precoated processless radiation-imageable lithographic printing precursor of the invention may be mounted on the platesetter or printing press. Alternatively, in the case of either machine, the radiation-sensitive medium may be applied to the substrate while the substrate resides thereon. The substrate may be an integral part of the press or it may be removably mounted on the press. In this embodiment, the imageable coating may be dried by means of a curing unit integral with the press, as described in U.S. Pat. No. 5,713,287 (Gelbart). It is also possible to coat a cylinder of a printing press with a layer of radiation-sensitive medium when the cylinder is separate from the press. Before applying the imageable coating to the substrate in any of the non-precoated embodiments, the substrate may be treated to enhance the adhesion of the imageable coating.

In a preferred embodiment of the invention, the radiation-sensitive medium of the coating is imagewise converted by means of the spatially corresponding imagewise generation of heat within the coating to form a hydrophobic area corresponding to areas imagewise irradiated. The imaging process itself may be by means of scanned laser radiation as described in U.S. Pat. No. 5,713,287. The wavelength of the laser light and the absorption range of the converter substance are chosen to match each other. The heat to drive the process of converting the irradiated areas of the precursor from hydrophilic to hydrophobic is produced via the substance capable of converting radiation into heat. The radiation-sensitive medium of the present invention, when coated and dried on a suitable substrate, therefore becomes hydrophobic under the action of heat. During subsequent wet lithographic offset printing, the exposed areas of the imageable coating will be hydrophobic and the lithographic printing ink will adhere preferentially to these areas, as water or fountain solution will be adhering to the hydrophilic areas. This makes the processless printing master of the present invention inherently negative-working. The method does not require a substrate of controlled hydrophilicity and provides great toughness in the exposed areas of the precursor, thereby extending the run length of the negative-working lithographic printing master.

Without limiting the scope of the invention in any way, the mechanism by which the irradiated areas of the layer become hydrophobic is believed to be as follows. When the radiation-imageable layer is imaged, the substance capable of converting radiation into heat provides imagewise distributed heat. This imagewise distributed heat renders the hydrophilic part of the polymer particles permeable to the material of the largely hydrophobic core, which thermally softens and penetrates the hydrophilic polymer to coalesce, forming an area on the surface of the layer that is hydrophobic. In the unirradiated areas, where the hydrophilic polymer has not been disrupted, the coated layer remains hydrophilic. During wet offset printing, the coalesced particles form an oleophilic region on the surface of the layer, whereas the unirradiated areas of the layer remain hydrophilic and take fountain solution.

The imaging process is irreversible when performed. The areas of the composition exposed to imaging radiation remain hydrophobic and cannot be reversed to form a useable processless radiation-imageable lithographic printing precursor by way of thermal treatment (heating or cooling), radiation treatment to the same or different imaging range of radiation. The composition and radiation-sensitive medium is aqueous-ineluable when coated and dried and is specifically not removable by water or fountain-solution when coated and dried.

As is evident, the radiation-sensitive medium and lithographic printing precursors of the present invention allow the combination of the benefits of the newer generation of polymer particle/coalescence-type of thermally sensitive media with the substrate-independence of a switchable polymer approach to plate-making. With the particles having a substantially hydrophilic nature, rather than merely superficial, there is also reduced scumming, a phenomenon that occurs when the waterbearing area of the master loses some of its hydrophilic nature and starts to take ink. This provides a master with excellent run-length, which is nevertheless producible from an aqueous based radiation-sensitive medium.

EXAMPLES

In the following examples, the chitosan was obtained as "High Viscosity Chitosan" from Vanson, Redmond, Wash., USA and the infrared dye is S0094 from FEW in Wolfen, Germany. The wetting agent is BYK-345 from BYK-Chemie, Wallingford, Conn., USA. All infrared laser exposure was at 830 nm wavelength using a Creo Trendsetter (™) platesetting machine.

Example 1

A plate was produced by coating the following formulation on to a grained, anodized aluminum plate to give a dry coating weight of 1 g/$m^2$: 30 g Chitosan/PS copolymer (13 wt % Chitosan and 87% Styrene) aqueous dispersion with 10% solids in aqueous and 9 g of 2 wt % infrared dye in ethanol. After drying at room temperature for 5 minutes, the plate was imaged using infrared laser exposure of 500 mJ/$cm^2$ at 15 Watts. The imaged plate was mounted onto a press (Ryobi), dampened with fountain solution for 30 seconds before the ink was applied to the plate. 1000 impressions were printed on coated paper with little deterioration of printing quality. During printing, the surface on background remains unchanged.

Example 2

A plate was produced by coating the following formulation on to ungrained, unanodized aluminum plate to give a dry coating weight of 1 g/$m^2$: 30 g Chitosan/PS copolymer (13 wt % Chitosan and 87% Styrene) aqueous dispersion with 10% solid and 9 g of 2 wt % infrared dye in ethanol. After drying at room temperature for 5 minutes, the plate was imaged using infrared laser exposure of 500 mJ/$cm^2$ at 15 Watts. The imaged plate was mounted onto a press (Ryobi), dampened with fountain solution for 30 seconds before the ink was applied to the plate. 1000 impressions were printed on coated paper with little deterioration of printing quality. During printing, the surface on background remains unchanged.

Example 3

A plate was produced by coating the following formulation on to a Ceramic Paper to give a dry coating weight of 1 g/$m^2$: 30 g Chitosan/PS copolymer (13 wt % Chitosan and 87% Styrene) aqueous dispersion with 10% solid and 9 g of 2 wt % infrared dye in ethanol. After drying at room temperature for 5 minutes, the plate was imaged using infrared laser exposure of 500 mJ/$cm^2$ at 15 Watts. The imaged sample was mounted onto a press (Ryobi), dampened with fountain solution for 30 seconds before the ink was applied to the plate. 3000 impressions were printed on coated paper with little deterioration of printing quality. During printing, the surface on background remains unchanged.

Example 4

A plate was produced by coating the following formulation on to a grained, anodized aluminum plate to give a dry coating weight of 1 g/$m^2$: 30 g Chitosan/PS/AN copolymer (13 wt % Chitosan, 78% Styrene, 9% Acrylonitrile) aqueous dispersion with 10% solid and 9 g of 2 wt % infrared dye in ethanol. After drying at 60° C. for 2 minute, the plate was imaged using infrared laser exposure of 500 mJ/$cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 5

A plate was produced by coating the following formulation on to a grained, anodized aluminum plate to give a dry coating weight of 1 g/$m^2$: 30 g Chitosan/PS/AA copolymer (13 wt % Chitosan, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 6

A plate was produced by coating the following formulation on to a grained, anodized aluminum plate to give a dry coating weight of 1 g/$m^2$: 15 g Gelatin/PS/AN copolymer (13 wt % Gelatin, 78% Styrene, 9% Acrylonitrile) aqueous dispersion with 10% solid and 15 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 7

A plate was produced by coating the following formulation on to a grained, anodized aluminum plate to give a dry coating weight of 1 g/$m^2$: 15 g Starch/PS/AN copolymer (13 wt % Starch, 78% Styrene, 9% Acrylonitrile) aqueous dispersion with 10% solid and 15 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 8

A plate was produced by coating the following formulation on to a grained, anodized aluminum plate to give a dry coating weight of 1 g/$m^2$: 24 g Chitosan/PS copolymer (13 wt % Chitosan and 87% Styrene) aqueous dispersion with 10% solid and 6 g Chitosan/PMMA/A copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 9

A plate was produced by coating the following formulation on to a grained, anodized aluminum plate to give a dry coating weight of 1 g/$m^2$: 24 g Chitosan/PS/AN copolymer (13 wt % Chitosan, 78% Styrene, 9% Acrylonitrile) aqueous dispersion dispersion with 10% solid and 6 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts.

The imaged plate was mounted onto a press (Multi), dampened with fountain solution for 30 seconds before the ink was applied to the plate. 1000 impressions were printed on uncoated paper. During printing, the surface on background remains unchanged.

Example 10

A plate was produced by coating the following formulation on to a grained, anodized aluminum plate to give a dry coating weight of 1 g/$m^2$: 30 g Chitosan/PS/AA copolymer (13 wt % Chitosan, 78% Styrene, 9% Acrylic acid) aqueous dispersion with 10% solid and 9 g of 5 wt % carbon black (CAB-O-JET 200) in water. After drying at 60° C. for 2 minutes, the plate was imaged using infrared laser exposure of 800 mJ/$cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 11

A plate was produced by coating the following formulation on to a grained, anodized aluminum plate to give a dry coating weight of 1 g/$m^2$: 30 g Starch/PS/AA copolymer (13 wt % starch, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 12

A plate was produced by coating the following formulation on to a grained, anodized aluminum plate to give a dry coating weight of 1 g/$m^2$: 30 g Gelatin/PS/AA copolymer (13 wt % Gelatin, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 13

A plate was produced by coating the following formulation on to a grained, anodized aluminum plate to give a dry coating weight of 1 g/$m^2$: 30 g Cellulose/PS/AA copolymer (13 wt % Cellulose, 78% Styrene, 9% Acrylic acid) aqueous dispersion with 10% solid and 9 g of 2 wt % infrared dye in ethanol. After drying at 60° C. for 2 minutes, the plate was imaged using infrared laser exposure of 500 Mj/$CM^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 14

A plate was produced by coating the following formulation on to a grained, anodized aluminum plate to give a dry coating weight of 1 g/$m^2$: 30 g Chitosan/PMMA/AA copolymer (13 wt % Chitosan, 78% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 Mj/$cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 15

A plate was produced by coating the following formulation on to a grained, anodized aluminum plate to give a dry coating weight of 1 g/$m^2$: 30 g Chitosan/PMMA/AA copolymer (13 wt % Chitosan, 39% Styrene, 36% Methyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$CM^2$ at 15 Watts. The imaged sample was mounted onto a press (Multi), dampened with fountain solution for 30 seconds before the ink was applied to the plate. 500 impressions were printed on uncoated paper. During printing, the surface on background remains unchanged.

Example 16

A plate was produced by coating the following formulation on to a grained, anodized aluminum plate to give a dry coating weight of 1 g/$m^2$: 25 g Chitosan/PS/AA copolymer (13 wt % Chitosan, 78% Styrene, 9% Acrylic acid) aqueous dispersion with 10% solid, 5 g of 10% Zinc oxide in ethanol and and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 17

A plate was produced by coating the following formulation on to a grained, anodized aluminum plate to give a dry coating weight of 1 g/$m^2$: 25 g Chitosan/PS/M copolymer (13 wt % Chitosan, 78% Styrene, 9% Acrylic acid) aqueous dispersion with 10% solid 5 g of 10% $SiO_2$ in ethanol and and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 5000 impressions were printed on uncoated paper. During printing, the surface on background remains unchanged.

Example 18

A plate was produced by coating the following formulation on to a grained, anodized aluminum plate to give a dry coating weight of 1 g/$m^2$: 30 g Chitosan/PnBMA/AA copolymer (13 wt % Chitosan, 78% n-butyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 19

A plate was produced by coating the following formulation on to a grained, anodized aluminum plate to give a dry coating weight of 1 g/$m^2$: 30 g Chitosan/PtBMA/AA copolymer (13 wt % Chitosan, 78% t-Butyl methacrylate, 9% Acrylic acid) aqueous dispersion with 10% solid-and 9 g of 2 wt % infrared dye in ethanol. After drying at 60° C. for 2 minutes, the plate was imaged using infrared laser exposure of 500 mJ/$cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 20

A plate was produced by coating the following formulation on to a grained, anodized aluminum plate to give a dry coating weight of 1 $g/m^2$: 30 g Chitosan/PEMA/AA copolymer (13 wt % Chitosan, 78% Ethyl methacrylate, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 500 impressions were printed on uncoated paper. During printing, the surface on background remains unchanged.

Example 21

A plate was produced by coating the following formulation on to a grained, anodized aluminum plate to give a dry coating weight of 1 $g/m^2$: 30 g Chitosan/PtBS/AA copolymer (13 wt % Chitosan, 78% 4-t-Butyl styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 10,000 impressions were printed on uncoated paper. During printing, the surface on background remains unchanged.

Example 22

A plate was produced by coating the following formulation on to a grained, anodized aluminum plate to give a dry coating weight of 1 $g/m^2$: 30 g Chitosan/PCIS/AA copolymer (13 wt % Chitosan, 78% 4-Chloro styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 4000 impressions were printed on uncoated paper. During printing, the surface on background remains unchanged.

Example 23

A plate was produced by coating the following formulation on to a grained, anodized aluminum plate to give a dry coating weight of 1 $g/m^2$: 30 g Chitosan/Pα MS/AA copolymer (13 wt % Chitosan, 78% α-methyl styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 4000 impressions were printed on uncoated paper. During printing, the surface on background remains unchanged.

Example 24

A plate was produced by coating the following formulation on to a grained, anodized aluminum plate to give a dry coating weight of 1 $g/m^2$: 30 g Chitosan/PMS/AA copolymer (13 wt % Chitosan, 78% 4-methyl styrene, 9% Acrylic acid) aqueous dispersion with 10% solid and 9 g of 2 wt % infrared dye in ethanol. After drying at 60° C. for 2 minutes, the plate was imaged using infrared laser exposure of 500 $mJ/cm^2$ at 15 Watts. The imaged plate was mounted onto a press (Multi), dampened with fountain solution for 30 seconds before the ink was applied to the plate. 1000 impressions were printed on uncoated paper. During printing, the surface on background remains unchanged.

Example 25

To a 10 L glass reactor equipped with thermometer, mechanical stirring, nitrogen inlet and heating bath, set to 60° C., containing a stirring solution under nitrogen of 120 g chitosan, 8.52 g of potassium persulfate and 8.53 g of sodium metabisulfite in 159 g of acetic acid and 7910 g of water, was added 712 g of styrene and 80 g of acrylic acid. After 6 hours, stirring was stopped and the reactor contents were filtered to give an opaque white liquid, 3 g of which was mixed with 1 g of 1% infrared dye in ethanol and 1 g of 0.2% wetting agent in water. When coated onto an aluminum substrate, dried, imaged with 830 nm laser radiation with an exposure of 300 $mJ/cm^2$ the resulting plate printed to over 5,000 pages without loss of coating in either exposed or unexposed areas.

Example 26

To a 10 L glass reactor equipped with thermometer, mechanical stirring, nitrogen inlet and heating bath, set to 60° C., containing a stirring solution under nitrogen of 120 g chitosan, 8.52 g of potassium persulfate and 8.53 g of sodium metabisulfite in 159 g of acetic acid and 7910 g of water, was added 633 g of styrene, then 158 g of acrylic acid. After 6 hours, stirring was stopped and the reactor contents were filtered to give an opaque white liquid, 3 g of which was mixed with 1 g of 1% infrared dye in ethanol and 1 g of 0.2% wetting agent in water. When coated onto an aluminum substrate, dried, imaged with 830 nm laser radiation with an exposure of 300 $mJ/cm^2$, the resulting plate printed to over 5,000 pages without loss of coating in either exposed or unexposed areas.

There have thus been outlined the important features of the invention in order that it may be better understood, and in order that the present contribution to the art may be better appreciated. Those skilled in the art will appreciate that the conception on which this disclosure is based may readily be utilized as a basis for the design of other compositions, elements and methods for carrying out the several purposes of the invention. It is most important, therefore, that this disclosure be regarded as including such equivalent compositions, elements and methods as do not depart from the spirit and scope of the invention.

What is claimed is:

1. A processless radiation-imageable lithographic printing precursor comprising a substrate and a dried and aqueous-ineluable coating of a radiation-sensitive medium on the substrate, the radiation-sensitive medium comprising:

a substance capable of converting radiation into heat; and a plurality of hydrophilic polymer particles, each of the hydrophilic polymer particles comprising: at least one thermally softenable hydrophobic polymer, at least one hydrophilic polymer and at least one bonding agent chemically bonded to the hydrophobic polymer and to the hydrophilic polymer.

2. The precursor of claim 1, wherein the coating is capable of becoming hydrophobic under the action of heat.

3. The precursor of claim 2, wherein the substance capable of converting radiation into heat is hydrophobic.

4. The precursor of claim 2, wherein the radiation is infrared radiation.

5. The precursor of claim 4, wherein the infrared radiation has wavelength between 700 nm and 1200 nm.

6. The precursor of claim 2, wherein the hydrophilic polymer has a primary amine group.

7. The precursor of claim 2, wherein the at least one hydrophilic polymer is at least one of a saceharide, a chitosan polymer, a polyethyleneimine polymer, a polyamine polymer, a polyvinylamine polymer, a polyallylamine polymer, a polydiallylamine polymer, an amino (meth)acrylate polymer, a polyamide polymer, a polyamide-epichiorohydrin polymer, a polyamine-epichiorohydrin polymer, a polyamidepolyamine-epichiorohydrin polymer, a dicyandiamide-polycondensation product polymer and a copolymer thereof.

8. A processless radiation-imageable lithographic printing precursor comprising a substrate and a dried and aqueous-ineluable coating of a radiation-sensitive medium on the substrate, the radiation-sensitive medium comprising:

a. a substance capable of converting radiation into heat; and b. a hydrophilic polymer; and c. at least one copolymer of a hydrophobic monomer and a bonding monomer, the bonding monomer chemically bonded to the hydrophilic polymer and to the hydrophobic monomer.

9. A processless radiation-imageable lithographic printing precursor comprising a substrate and a dried and aqueous-incluable coating of a radiation-sensitive medium on the substrate, the radiation-sensitive medium comprising:

a substance capable of converting radiation into heat; and a hydrophilic polymer; and at least one copolymer of a hydrophobic monomer and a bonding monomer, the bonding monomer chemically bonded to the hydrophilic polymer and to the hydrophobic monomer wherein the coating is capable of becoming hydrophobic under the action of heat.

10. The precursor of claim 9, wherein the substance capable of converting radiation into heat is hydrophobic.

11. The precursor of claim 10, wherein the radiation is infrared radiation.

12. The precursor of claim 11, wherein the infrared radiation has wavelength between 700 nm and 1200 nm.

13. The precursor of claim 9, wherein the hydrophilic polymer has a primary amine group.

14. The precursor of claim 9, wherein the at least one hydrophilic polymer is at least one of a saccharide, a chitosan polymer, a polyethyleneimine polymer, a polyamine polymer, a polyvinylamine polymer, a polyallylamine polymer, a polydiallylamine polymer, an amino (meth)acrylate polymer, a polyamide polymer, a polyamide-epichlorohydrin polymer, a polyamine-epichlorohydrin polymer, a polyamidepolyamine-epichlorohydrin polymer, a dicyandiamide-polycondensation product polymer and a copolymer thereof.

15. A processless radiation-imageable lithographic printing precursor comprising a substrate and a dried and aqueous-ineluable coating of a radiation-sensitive medium on the substrate, the radiation-sensitive medium comprising hydrophilic polymer particles, the hydrophilic polymer particles being hydrophilic to a substantial depth and each of the hydrophilic polymer particles comprising a hydrophilic polymer and at least one copolymer of a hydrophobic monomer and a monomer that has a carboxylic group, said radiation-sensitive medium further comprising a substance capable of converting radiation into heat.

16. A processless radiation-imageable lithographic printing precursor comprising a substrate and a dried and aqueous-ineluable coating of a radiation-sensitive medium on the substrate, the radiation-sensitive medium comprising hydrophilic polymer particles, the hydrophilic particles being hydrophulic to a substantial depth and comprised of a hydrophilic polymer and at least one copolymer of a hydrophobic monomer and a monomer that has a carboxylic group, wherein the coating is capable of becoming hydrophobic under the action of heat, said precursor further comprising a hydrophobic substance capable of converting radiation into heat.

17. The precursor of claim 16, wherein the radiation is infrared radiation.

18. The precursor of claim 17, wherein the infrared radiation has wavelength between 700 nm and 1200 nm.

19. The precursor of claim 16, wherein the hydrophilic polymer has a primary amine group.

20. The precursor of claim 16, wherein the at least one hydrophilic polymer is at least one of a saccharide, a chitosan polymer, a polyethyleneimine polymer, a polyamine polymer, a polyvinylamine polymer, a polyallylamine polymer, a polydiallylamine polymer, an amino (meth)acrylate polymer, a polyamide polymer, a polyamide-epichlorohydrin polymer, a polyamine-epichlorohydrin polymer, a polyamidepolyamine-epichlorohydrin polymer, a dicyandiamide-polycondensation product polymer and a copolymer thereof.

21. A processless radiation-imageable lithographic printing precursor comprising a substrate and a dried and aqueous-ineluable hydrophilic coating of a radiation-sensitive medium on the substrate, the radiation-sensitive medium comprising hydrophilic polymer particles, the particles comprising chitosan and at least one thermally softenable hydrophobic polymer, the coating capable of becoming hydrophobic under the action of heat, said precursor further comprising a hydrophobic substance capable of converting radiation into heat.

* * * * *

UNITED STATES PATENT AND TRADEMARK OFFICE

CERTIFICATE OF CORRECTION

PATENT NO. : 7,323,288 B2
APPLICATION NO. : 10/647913
DATED : January 29, 2008
INVENTOR(S) : Yisong Yu et al.

It is certified that error appears in the above-identified patent and that said Letters Patent is hereby corrected as shown below:

| | |
|---|---|
| Title Page, Item (60) | Delete "Provisional application No. 60/436,182, filed on Dec. 23, 2002" and insert -- Provisional application No. 60/436,182, filed on April 14, 2003 --, therefor. |
| Title Page, Item (57) (Abstract), Line 5 | Delete "Th" and insert -- The --, therefor. |
| Col. 19, Line 16 | In Claim 7, delete "saceharide," and insert -- saccharide, --, therefor. |
| Col. 19, Line 21 | In Claim 7, delete "epichiorohydrin" and insert -- epichlorohydrin --, therefor. |
| Col. 19, Line 21 | In Claim 7, delete "epichiorohydrin" and insert -- epichlorohydrin --, therefor. |
| Col. 19, Line 22 | In Claim 7, delete "epichiorohydrin" and insert -- epichlorohydrin --, therefor. |
| Col. 19, Line 38 | In Claim 9, delete "incluable" and insert -- ineluable --, therefor. |
| Col. 20, Line 23 | In Claim 16, delete "hydrophulic" and insert -- hydrophilic --, therefor. |

Signed and Sealed this

First Day of September, 2009

David J. Kappos

*Director of the United States Patent and Trademark Office*